(12) United States Patent  
Shiraishi (10) Patent No.: US 10,659,169 B2
(45) Date of Patent: May 19, 2020

(54) OPTICAL TRANSMITTER (71) Applicant: FUJITSU LIMITED, Kawasaki-shi, Kanagawa (JP)

(72) Inventor: Takashi Shiraishi, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/527,839

(22) Filed: Jul. 31, 2019

(65) Prior Publication Data
US 2020/0052797 A1 Feb. 13, 2020

(30) Foreign Application Priority Data

Aug. 10, 2018 (JP) .................. 2018-151308

(51) Int. Cl.
H04B 10/80 (2013.01)
H05K 3/32 (2006.01)
H05K 3/10 (2006.01)

(52) U.S. Cl.
CPC ........... *H04B 10/801* (2013.01); *H05K 3/103* (2013.01); *H05K 3/321* (2013.01)

(58) Field of Classification Search
USPC .................. 398/135–139, 164, 182–201
See application file for complete search history.

(56) References Cited

U.S. PATENT DOCUMENTS

| 6,873,800 B1* | 3/2005 | Wei ...................... G02B 6/4204 385/14 |
| 7,013,088 B1* | 3/2006 | Jiang .................... G02B 6/4204 385/88 |
| 7,371,014 B2* | 5/2008 | Willis ................... G02B 6/3887 385/24 |
| 8,503,888 B2* | 8/2013 | Takemoto ............ H04B 10/503 398/182 |
| 8,989,588 B2* | 3/2015 | Afriat .................... H04B 10/60 398/136 |
| 9,107,297 B2* | 8/2015 | Sugiyama ............. H05K 1/0215 |
| 9,244,230 B2* | 1/2016 | Sugiyama ............. G02B 6/4201 |
| 9,316,799 B2* | 4/2016 | Shiraishi ................. G02B 6/42 |
| 9,507,235 B2* | 11/2016 | Sugiyama ................ G02F 1/21 |

(Continued)

FOREIGN PATENT DOCUMENTS

| JP | H10-223788 A | 8/1998 |
| JP | 2004-119506 A | 4/2004 |

(Continued)

*Primary Examiner* — Agustin Bello
(74) *Attorney, Agent, or Firm* — Fujitsu Patent Center (57) ABSTRACT A transmitter includes a first PCB having a first surface on which first ground wires and anode wires connecting a light-emitting element and a driver are formed, the anode wires being covered with an insulating section, and a second surface on which a second ground wire coupled to the first ground wires is formed, the second surface being opposite the first surface, a connector that supports the first PCB and is coupled to the second ground wire, a conductive housing that covers the first PCB and the connector, a coupling member in contact with the housing and the first ground wires, the coupling member coupling the housing and the first ground wires, and a second PCB on which the connector and the housing are mounted, the second PCB including a third ground wire that is coupled via the connector to the second ground wire and is coupled to the housing.

4 Claims, 8 Drawing Sheets

(56) References Cited

U.S. PATENT DOCUMENTS

| | | | |
|---|---|---|---|
| 9,535,213 B2* | 1/2017 | Sugiyama | G02F 1/2255 |
| 10,061,179 B2* | 8/2018 | Miyazaki | H04B 10/501 |
| 10,078,189 B2* | 9/2018 | Uchiyama | G02B 6/4204 |
| 10,444,452 B2* | 10/2019 | Noguchi | G02B 6/4281 |
| 10,473,998 B2* | 11/2019 | Sugamata | G02F 1/2252 |
| 2004/0081468 A1* | 4/2004 | Ichihara | H04B 10/801 |
| | | | 398/164 |
| 2006/0114673 A1* | 6/2006 | Cunnien | B60Q 1/2696 |
| | | | 362/235 |
| 2007/0102830 A1* | 5/2007 | Muto | H05K 1/118 |
| | | | 257/784 |
| 2007/0126524 A1* | 6/2007 | Yagisawa | H05K 1/0219 |
| | | | 333/33 |
| 2007/0248363 A1* | 10/2007 | Kagaya | H01S 5/02248 |
| | | | 398/200 |
| 2009/0000809 A1* | 1/2009 | Yagisawa | G02B 6/43 |
| | | | 174/254 |
| 2009/0297159 A1* | 12/2009 | Margolin | G02B 6/4201 |
| | | | 398/135 |
| 2010/0215324 A1* | 8/2010 | Ban | G02B 6/4201 |
| | | | 385/88 |
| 2010/0232806 A1* | 9/2010 | Kagaya | H04B 10/2504 |
| | | | 398/183 |
| 2011/0008056 A1* | 1/2011 | Yagisawa | G02B 6/4201 |
| | | | 398/182 |
| 2011/0249980 A1* | 10/2011 | Takemoto | H04B 10/503 |
| | | | 398/201 |
| 2012/0051683 A1* | 3/2012 | Sugiyama | G02F 1/035 |
| | | | 385/1 |
| 2012/0076454 A1* | 3/2012 | Shiraishi | G02B 6/42 |
| | | | 385/14 |
| 2015/0261063 A1* | 9/2015 | Sugiyama | G02F 1/225 |
| | | | 385/2 |
| 2015/0362823 A1* | 12/2015 | Sugiyama | G02F 1/225 |
| | | | 385/3 |
| 2016/0011488 A1* | 1/2016 | Sugiyama | G02F 1/0121 |
| | | | 398/188 |
| 2016/0161771 A1* | 6/2016 | Sugiyama | G02B 6/4201 |
| | | | 385/3 |
| 2017/0212402 A1* | 7/2017 | Ishii | H01R 12/592 |
| 2019/0208630 A1* | 7/2019 | Mandelboum | F21V 19/0015 |
| 2020/0052797 A1* | 2/2020 | Shiraishi | H05K 3/321 |

FOREIGN PATENT DOCUMENTS

| | | |
|---|---|---|
| JP | 2012-068539 A | 4/2012 |
| JP | 2016-092303 A | 5/2016 |

* cited by examiner

FIG. 8 US 10,659,169 B2

OPTICAL TRANSMITTER

CROSS-REFERENCE TO RELATED APPLICATION

This application is based upon and claims the benefit of priority of the prior Japanese Patent Application No. 2018-151308, filed on Aug. 10, 2018, the entire contents of which are incorporated herein by reference.

FIELD

The embodiments discussed herein are related to an optical transmitter.

BACKGROUND

Recently, in the fields of servers and high-performance computers, optical transmitters that convert electrical signals to optical signals and transmit the optical signals have been used to enable a large amount of data to be transmitted. Optical transmitters that transmit data by using a plurality of channels (multichannel optical transmitters) are known.

Figure 1:
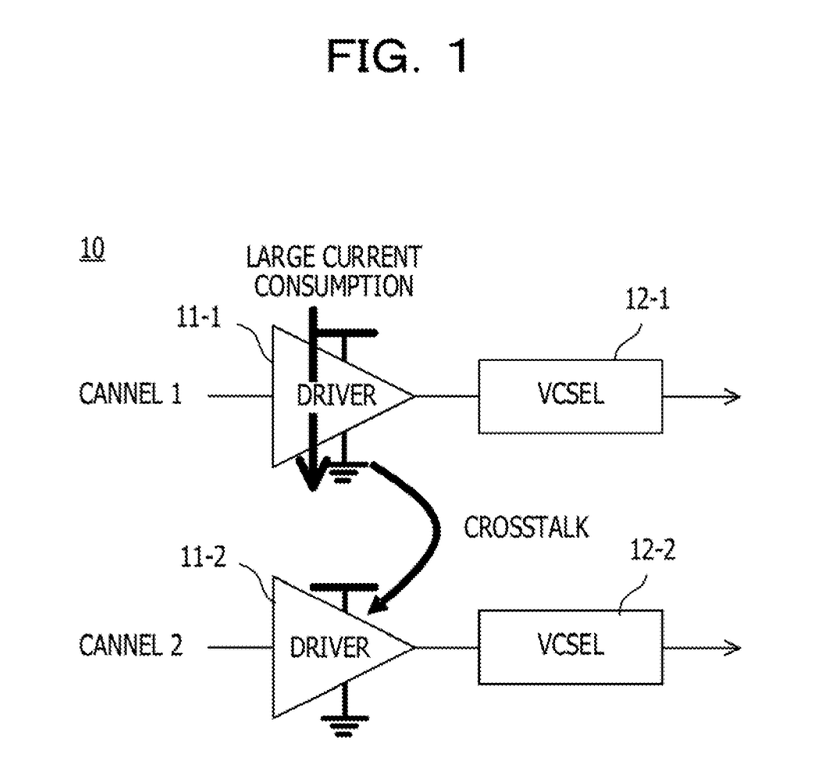
FIG. 1 illustrates a block diagram of a multichannel optical transmitter, and crosstalk.

FIG. 1 illustrates a block diagram of a multichannel optical transmitter, and crosstalk.

FIG. 1 is a block diagram of a dual channel (channel 1 and channel 2) optical transmitter. For channel 1 of the optical transmitter 10, a driver 11-1 and a vertical-cavity surface-emitting laser (VCSEL) 12-1 are provided; for channel 2, a driver 11-2 and a VCSEL 12-2 are provided. The drivers 11-1 and 11-2 drive the VCSELs 12-1 and 12-2, respectively, and each of the VCSELs 12-1 and 12-2 converts electrical signals input thereto to optical signals to transmit data. As the current consumption of the driver 11-1 grows large, the effects of crosstalk through the ground increase.

There are known hybrid integrated modules that achieve high-speed operations with their simple configurations and shorten manufacturing processes, enabling reduced manufacturing costs.

Examples of the related art are disclosed in Japanese Laid-open Patent Publication No. 2004-119506, Japanese Laid-open Patent Publication No. 10-223788, Japanese Laid-open Patent Publication No. 2016-92303, Japanese Laid-open Patent Publication No. 2012-68539, and so on.

Currently, the pitch between channels is 250 µm, and it is desirable to achieve a higher density pitch in the future. It is also desirable to improve the transmission speed, and the transmission speed is planned to be increased to 56 gigabits per second (Gbps) per channel in the future.

In a multichannel optical transmitter, with the increasing current flowing in a driver because of a narrowed pitch between channels and speed-up, crosstalk through the ground has remarkable effects.

In view of the above, it is desirable to reduce crosstalk between channels.

SUMMARY

According to an aspect of the embodiments, an optical transmitter includes a light emitting element, a driver that drives the light emitting element, a first printed circuit board having a first surface on which a plurality of first ground wires and a plurality of anode wires of a plurality of channels connecting the light emitting element and the driver are formed, the plurality of anode wires being covered with an insulating section, and a second surface on which a second ground wire coupled to the plurality of first ground wires is formed, the second surface being opposite the first surface; a connector that supports the first printed circuit board and is coupled to the second ground wire, an electrically conductive housing that covers the first printed circuit board and the connector, a coupling member in contact with the housing and the first ground wires, the coupling member electrically coupling the housing and the first ground wires together, and a second printed circuit board on which the connector and the housing are mounted, the second printed circuit board including a third ground wire that is electrically coupled via the connector to the second ground wire and is electrically coupled to the housing.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described with reference to the accompanying drawings.

Figure 2:
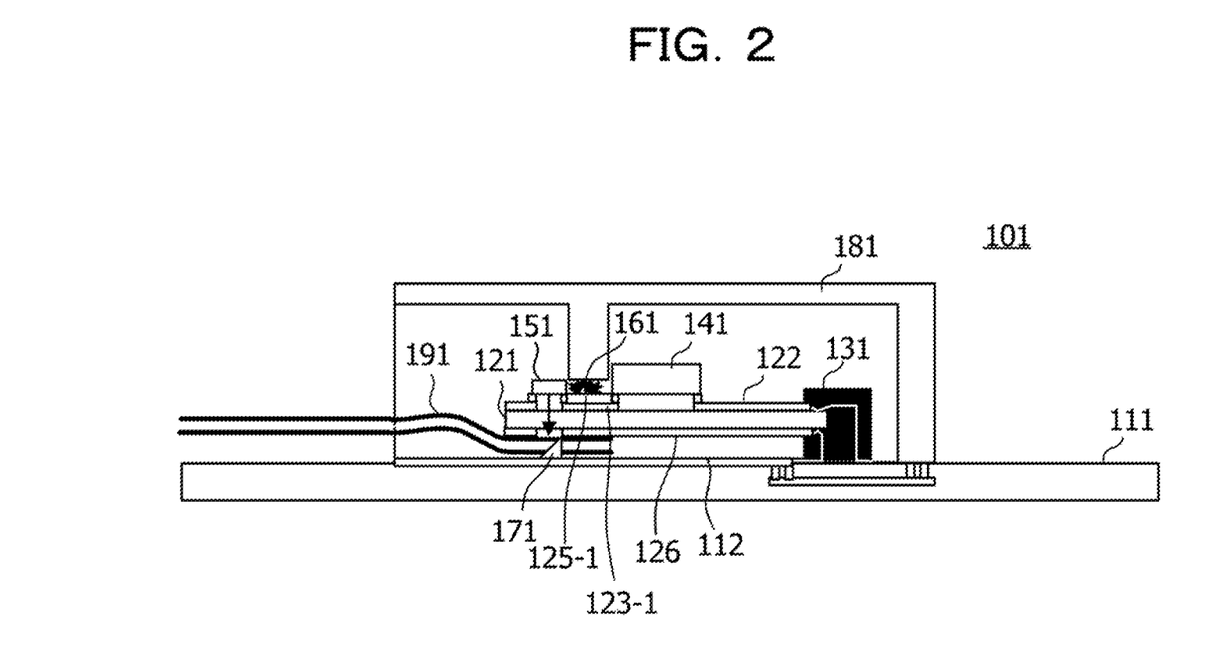
FIG. 2 is a sectional view (1) of an optical transmitter according to an embodiment.
Figure 3:
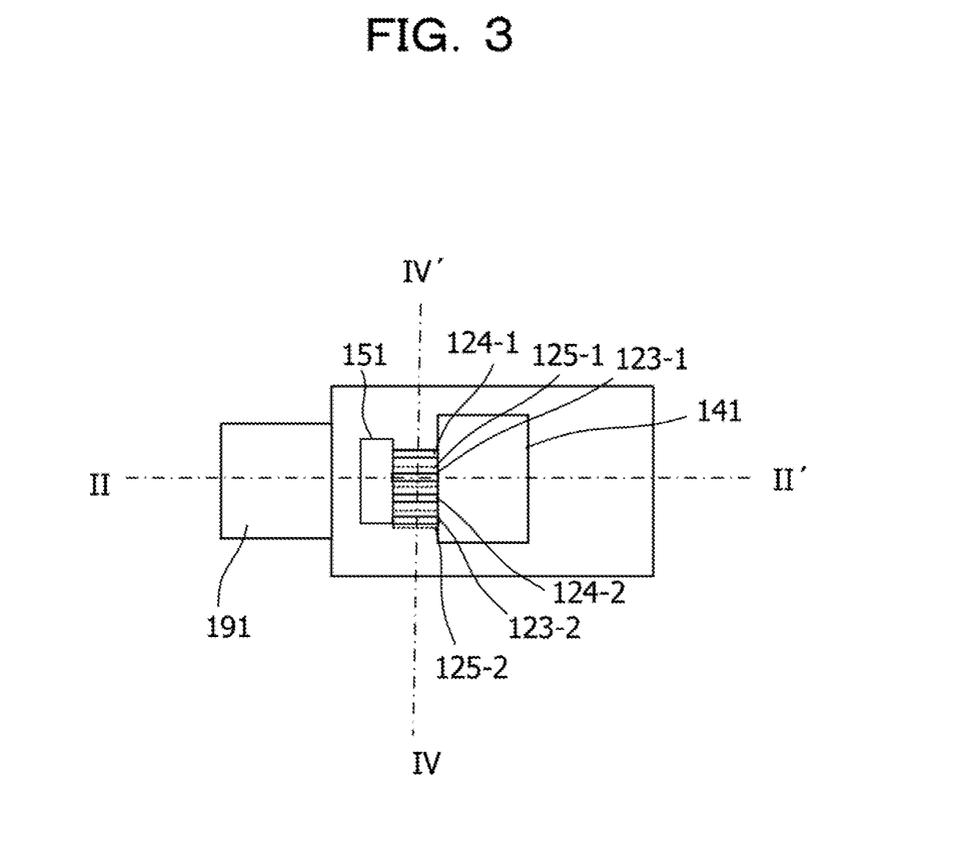
FIG. 3 is a top view of an FPC of an optical transmitter according to an embodiment.
Figure 4:
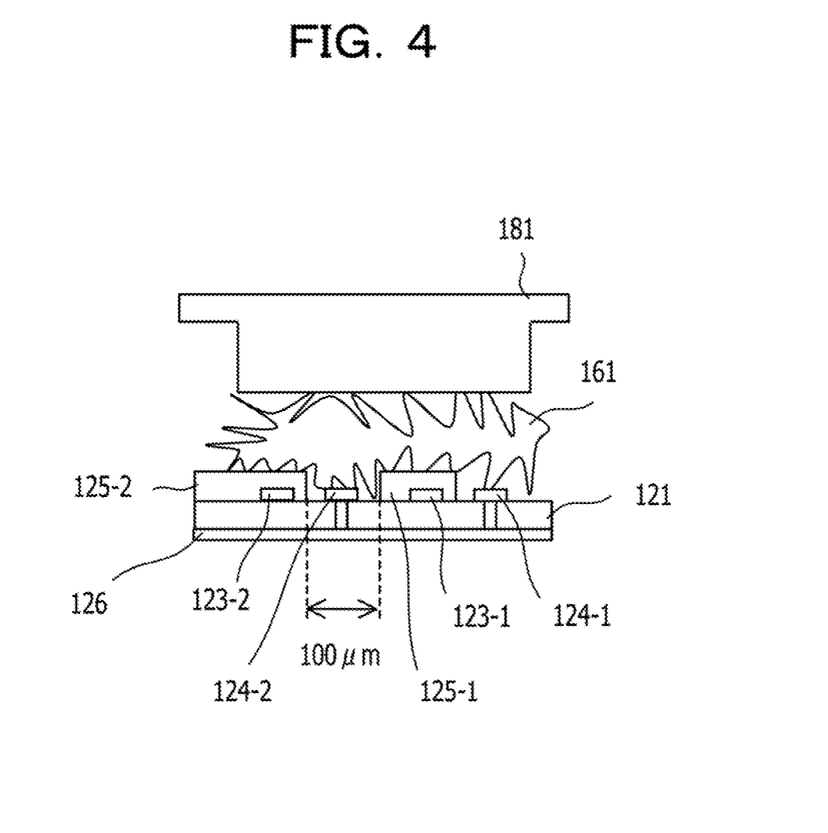
FIG. 4 is a sectional view (2) of an optical transmitter according to an embodiment.

FIG. 2 is a sectional view (1) of an optical transmitter according to an embodiment. FIG. 3 is a top view of a flexible printed circuits (FPC) board (herein referred to as an FPC) of the optical transmitter according to the embodiment. FIG. 4 is a sectional view (2) of the optical transmitter according to the embodiment. FIG. 2 is a sectional view taken along the line II-II of FIG. 3, Illustrating an optical transmitter 101. FIG. 4 is a sectional view taken along the line IV-IV of FIG. 3, illustrating the optical transmitter 101.

The optical transmitter 101 includes a printed circuit board 111, an FPC 121, a connector 131, a driver 141, a VCSEL 151, a conductor 161, a mirror 171, a housing 181, and an optical waveguide 191. The optical transmitter 101 is, for example, coupled to a device, such as a server, a supercomputer, or video equipment, and converts electrical signals output from the device to optical signals to output the optical signals to a device at the receiving end. The optical transmitter 101 transmits signals on two channels. The number of channels in the embodiment is exemplary and may be more than two.

The connector 131, the housing 181, and the optical waveguide 191 are mounted on the printed circuit board 111, to which the FPC 121 is coupled via the connector 131. The printed circuit board 111 includes a ground wire (hereinafter denoted as a ground) 112, and the ground 112 is electrically coupled to (has electrical continuity with) the housing 181. The ground 112 is electrically coupled via the connector 131 to the ground 126 of the FPC 121.

The FPC 121 is a circuit board having flexibility. The FPC 121 is an example of a first printed circuit board. The FPC 121 is made of a material, such as polyimide, that is thin to provide low electrical signal losses at high frequencies and is transparent. In the embodiment, the FPC 121 is a two-layer FPC, and both surfaces of the FPC are patterned into wires. In the embodiment, a surface facing the housing 181 of both the surfaces of the FPC 121 is referred to as a front surface, and the opposite surface facing the printed circuit board 111 is referred to as a back surface.

On the front surface of the FPC 121, the driver 141 and the VCSEL 151 are flip-chip mounted. On the front surface of the FPC 121, a wire 122 that connects the connector 131 and the driver 141 is provided. On the front surface of the FPC 121, a ground 124-$i$ ($i$=1 or 2) and an anode wire 123-1 that connect the driver 141 and the VCSEL 151 are provided. The anode wires 123-1 and 123-2 are signal lines of the channels 1 and 2, respectively. The grounds 124-1 and 124-2 are ground wire lines of the channels 1 and 2, respectively. As illustrated in FIG. 3, the ground 124-$i$ and the anode wire 123-$i$ are arranged alternately.

The anode wire 123-$i$ is covered with an insulating solder resist 125-$i$. The anode wire 123-$i$ and the conductor 161 are electrically insulated from each other by the solder resist 125-$i$. In the embodiment, a gap between the solder resist 125-1 and the solder resist 125-2 is 100 μm. The solder resist 125-$i$ is an example of an insulating section.

On the back surface of the FPC 121, the ground 126 is provided. The ground 126 is electrically coupled via the connector 131 to the ground 112. The ground 126 is electrically coupled to the ground 124-$i$ by a wire passing through the FPC 121.

The connector 131 is mounted on the printed circuit board 111 and supports the FPC 121. The connector 131 outputs, via the wire 122 to the driver 141, an electrical signal input from a device to which the optical transmitter 101 is coupled. The connector 131 electrically couples the ground 126 of the FPC 121 and the ground 112 of the printed circuit board 111 together.

The driver 141 and the VCSEL 151 transmit signals on two channels. The driver 141 includes integrated circuits for two channels, and the VCSEL 151 includes light emitting elements for two channels.

The driver 141 drives the VCSEL 151 and outputs electrical signals of each channel via the anode wire 123-1 to the VCSEL 151.

The VCSEL 151 is a semiconductor laser that converts input electrical signals to optical signals. The VCSEL 151 converts electrical signals input from the driver 141 to optical signals and outputs the optical signals to the mirror 171. The VCSEL 151 is an example of a light emitting element.

The conductor 161 is made of a material having electrical conductivity, for example, metal fibers or small scraps of gold, copper, or iron, and has fine asperities. The conductor 161 is, for example, a metal fiber aggregate (for example, a bundle, duster, or any other form of metal fibers) such as steel wool or lame curl wire. For metal fibers, for example, gold wire or the like is used.

The conductor 161, which is an aggregate of metal fibers, has elasticity and deforms to fit into a gap between the housing 181 and the FPC 121 to make contact with the housing 181 and the grounds 124-1. Thus, the housing 181, the grounds 124-$i$ and 126 of the FPC 121, and the ground 112 of the printed circuit board 111 are electrically coupled together. The diameter of metal fibers is smaller than a distance between the adjacent anode wires 123-$i$ and, for example, is smaller than a gap between the resists 125-1 covering the adjacent anode wires 123-$i$. Thus, the metal fibers enter a gap between the resist 125-1 and the resist 125-2 to be coupled to the ground 124-2. For example, in the embodiment, the diameter of metal fibers constituting the conductor 161 is smaller than a gap of 100 μm between the resist 125-1 and the resist 125-2.

The conductor 161 has elasticity, which may reduce the pressure exerted to the housing 181 and the FPC 121. The conductor 161 is attachable to and detachable from the housing 181 and the FPC 121. The conductor 161 is an example of a coupling member.

The mirror 171 is installed within the optical waveguide 191 and reflects optical signals output from the VCSEL 151 into the optical waveguide 191. The reflected optical signals are transmitted via the optical waveguide 191 to an optical receiver (not illustrated) coupled to the optical waveguide 191.

The housing 181 covers the FPC 121, the connector 131, the driver 141, and the VCSEL 151 to protect the FPC 121, the connector 131, the driver 141, and the VCSEL 151. The housing 181 has electrical conductivity and, for example, is made of metal such as aluminum. The protruding portion of the inner ceiling of the housing 181 is in contact with the conductor 161. Thus, the housing 181 and the grounds 124-1 are electrically coupled to each other. The housing 181 is electrically coupled to the ground 112.

The optical waveguide 191 is a transmission path for transmission of optical signals and couples the optical transmitter 101 to an optical receiver (not illustrated) that receives optical signals output from the optical transmitter 101.

As described above, in the optical transmitter 101, the housing 181 and the ground 124-$i$ of the FPC 121 are electrically coupled by the conductor 161. Thus, the housing 181, the grounds 124-$i$ and 126 of the FPC 121, and the ground 112 of the printed circuit board 111 are electrically coupled together. Thus, the grounds are reinforced and crosstalk between channels is reduced.

Figure 5:
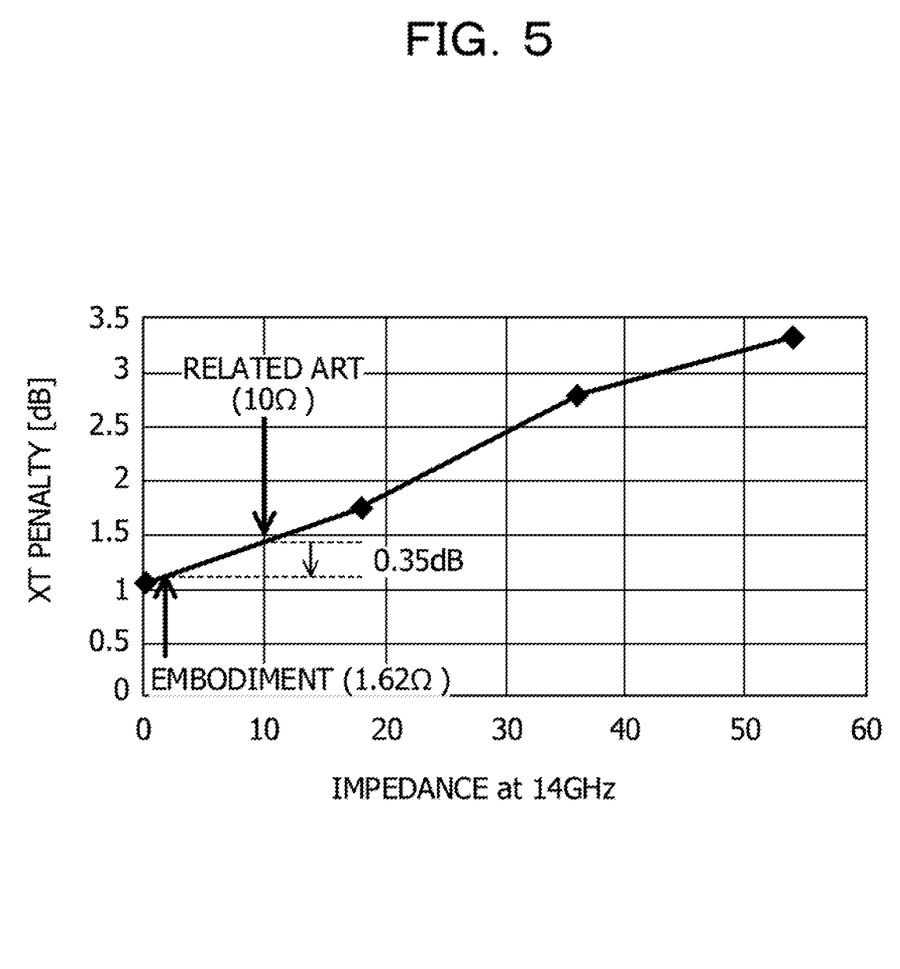
FIG. 5 is a diagram illustrating the ground wire impedance and the crosstalk penalty between a VCSEL and a driver in the related art and in an embodiment.

FIG. 5 is a diagram illustrating the ground wire impedance and the crosstalk (XT) penalty between a VCSEL and a driver in the related art and in the embodiment.

The vertical axis in FIG. 5 represents the crosstalk penalty (dB) and the horizontal axis represents the impedance of the ground 124-$i$ between the driver 141 and the VCSEL 151.

In an optical transmitter according to the related art, a housing and the ground between a VCSEL and a driver are not electrically coupled together, and the housing and the ground of a printed circuit board are not electrically coupled together. In contrast, in the optical transmitter 101 according to the embodiment, the housing 181, the grounds 124-$i$ and 126 of the FPC 121, and the ground 112 of the printed circuit board 111 are electrically coupled together, so that the grounds are reinforced.

In the optical transmitters according to the related art and according to the embodiment, it is assumed that the transmission rate is 28 Gbps and the Nyquist frequency is 14 GHz. In this case, in the related art, the impedance of the ground between a VCSEL and a driver is 10Ω and the crosstalk penalty is 1.45 dB. In the embodiment, the impedance of the ground 124-1 between the VCSEL 151 and the driver 141 is 1.62Ω and the crosstalk penalty is 1.1 dB. In the embodiment, the crosstalk penalty is 0.35 dB lower than in the related art.

In the optical transmitter 101 according to the embodiment, crosstalk between channels may be reduced.

In the case of establishing electrical continuity between the housing 181 and the ground 124-$i$ of the FPC 121 without using the conductor 161, it is conceivable to provide the housing 181 with fine asperities to cause protrusions of the asperities and the ground 124-$i$ to come in contact with each other. However, because the interval between channels is very narrow, a very high level of accuracy is required in mounting the housing 181 so that fine protrusions of the housing 181 and the ground 124-1 come in contact with each other. Therefore, it is difficult to provide the housing 181 with fine asperities to cause protrusions of the asperities and the ground 124-$i$ to come in contact with each other. In the optical transmitter 101 according to the embodiment, owing to the use of the conductor 161, a very high level of accuracy is not required at the time of mounting the housing 181 on the printed circuit board 111, which facilitates construction of the optical transmitter 101.

It is also conceivable to provide the back surface of the FPC 121 with the anode wires 123-1 and the grounds 124-$i$ and provide the front surface of the FPC 121 with the ground 126 to cause the housing 181 and the ground 126 to come in contact with each other without using the conductor 161. In this case, the area of the ground 126 is large and therefore it is easy to cause the housing 181 and the ground 126 to come in contact with each other, and a high level of accuracy is not required at the time of mounting the housing 181. However, if the anode wires 123-$i$ are on the back surface of the FPC 121, the anode wires 123-$i$ are far from the driver 141 and the VCSEL 151 and therefore signals are degraded. In the optical transmitter 101 according to the embodiment, the anode wires 123-$i$ are provided on the front surface of the FPC 121 close to the driver 141 and the VCSEL 151 and therefore signals are less degraded.

Figure 6:
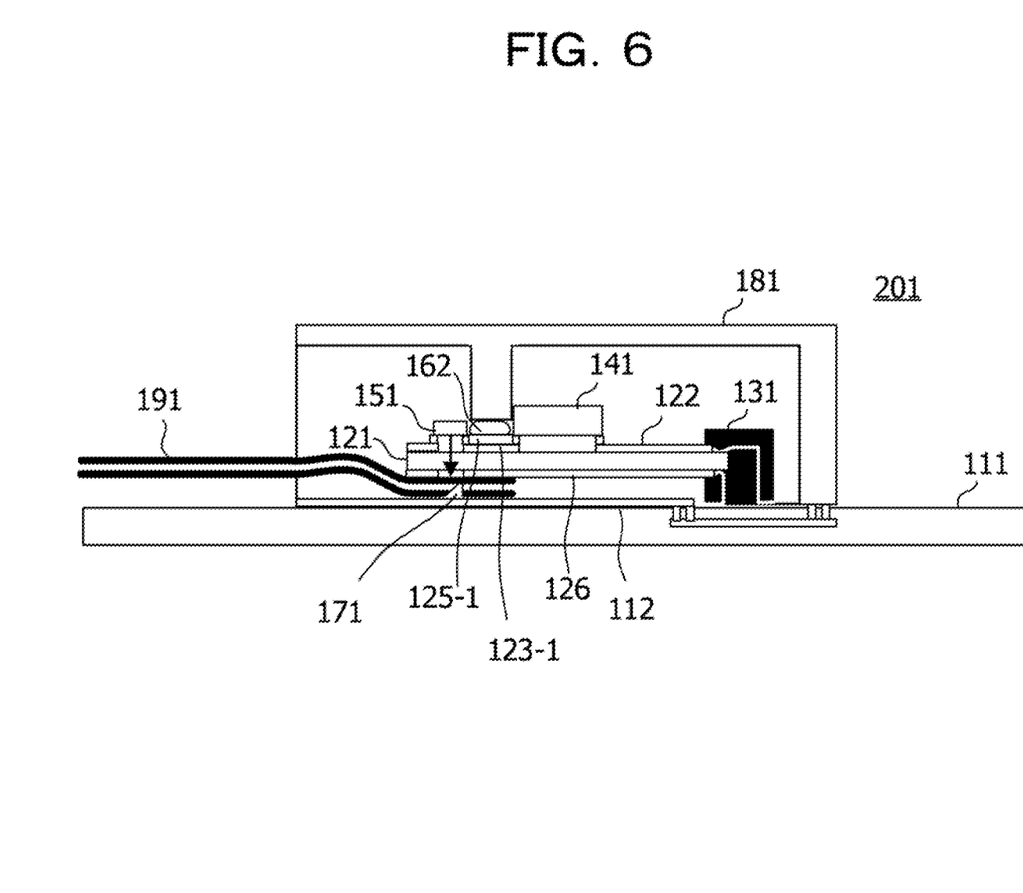
FIG. 6 is a sectional view (1) of an optical transmitter according to an embodiment.
Figure 7:
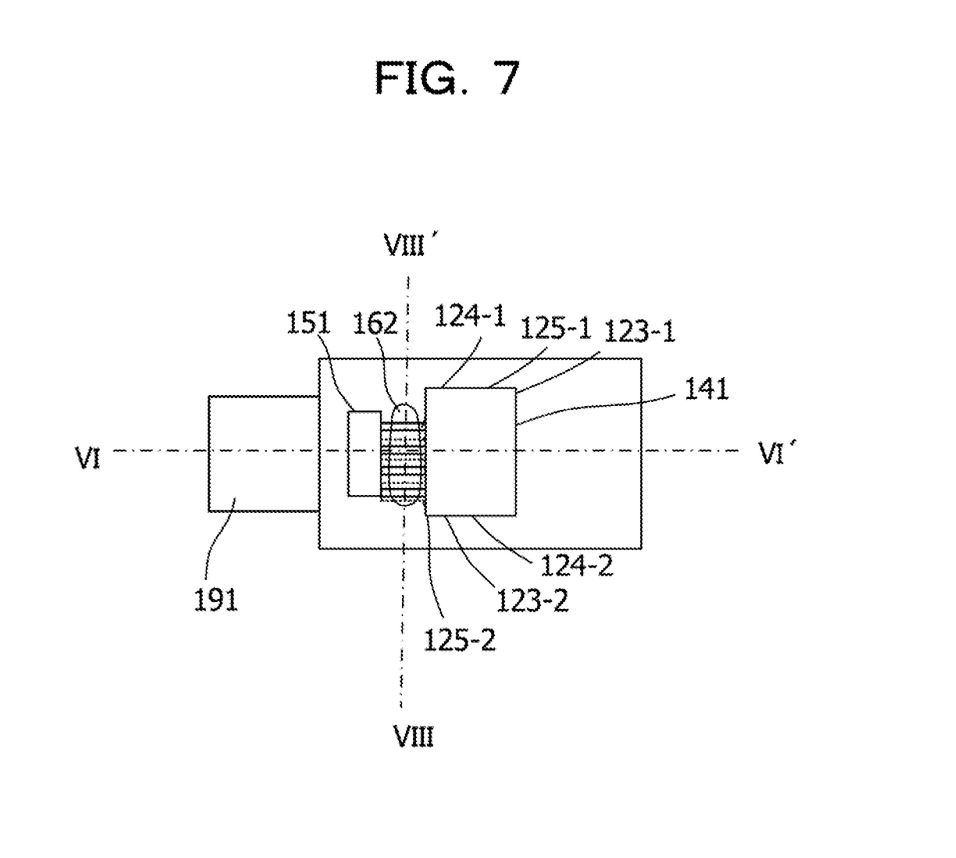
FIG. 7 is a top view of an FPC of an optical transmitter according to an embodiment.
Figure 8:
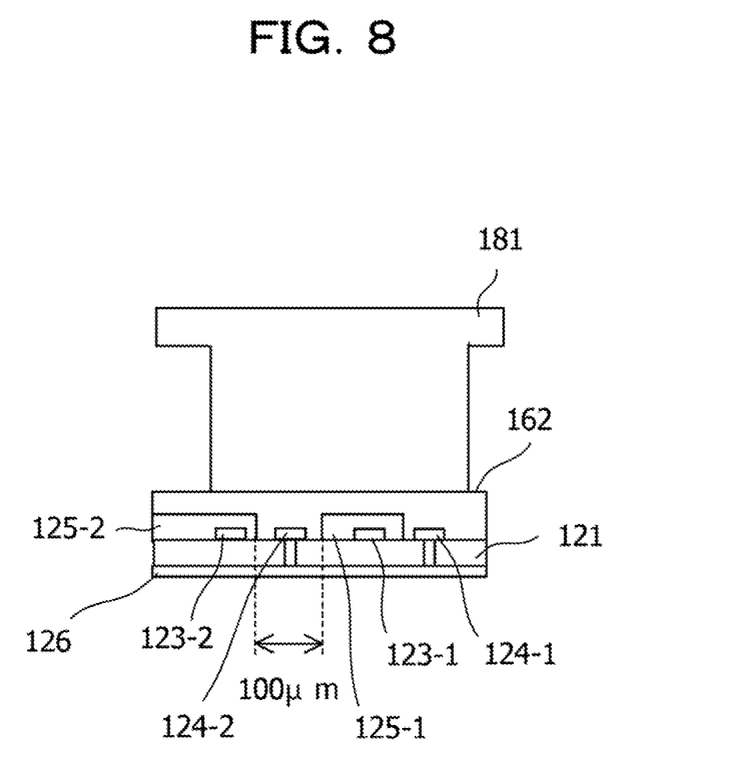
FIG. 8 is a sectional view (2) of an optical transmitter according to an embodiment.

FIG. 6 is a sectional view (1) of an optical transmitter according to another embodiment. FIG. 7 is a top view of an FPC of the optical transmitter according to the other embodiment. FIG. 8 is a sectional view (2) of the optical transmitter according to the other embodiment. FIG. 6 is a sectional view taken along the line VI-VI of FIG. 7, illustrating an optical transmitter 201. FIG. 8 is a sectional view taken along the line VIII-VIII of FIG. 7, illustrating the optical transmitter 201.

The optical transmitter 201 includes the printed circuit board 111, the FPC 121, the connector 131, the driver 141, the VCSEL 151, the conductor 161, the mirror 171, the housing 181, and the optical waveguide 191.

In FIG. 6 to FIG. 8, components having functions similar to the functions of components of the embodiment illustrated in FIG. 2 to FIG. 4 are denoted by the same reference numerals and the description thereof is omitted.

In the optical transmitter 101 according to the embodiment, the conductor 161, which is, for example, a metal fiber aggregate, is used to electrically couple the ground 124-$i$ and the housing 181 together; however, in the optical transmitter 201 according to the other embodiment, an electrically conductive adhesive 162 is used.

In the optical transmitter 201, the electrically conductive adhesive 162 is used to electrically couple the ground 124-$i$ of the FPC 121 and the housing 181 together. The electrically conductive adhesive 162 has electrical conductivity, flowability, and viscosity. The electrically conductive adhesive 162 is, for example, a silver paste. The electrically conductive adhesive 162 is an example of the coupling member.

The electrically conductive adhesive 162 is applied onto the ground 124-$i$ and the solder resist 125-$i$. After the electrically conductive adhesive 162 has been applied, the housing 181 is mounted on the printed circuit board 111. This causes the electrically conductive adhesive 162 and the protruding portion of the ceiling inside the housing 181 to come in contact with each other. Thus, the grounds 124-$i$ and 126 of the FPC 121 and the housing 181 are electrically coupled together.

In the optical transmitter 201, the housing 181 and the ground 124-$i$ of the FPC 121 are electrically coupled by the electrically conductive adhesive 162. Thus, the housing 181, the grounds 124-$i$ and 126 of the FPC 121, and the ground 112 of the printed circuit board 111 are electrically coupled together. Thus, the grounds are reinforced and crosstalk between channels is reduced.

In the optical transmitter 201 according to the other embodiment, crosstalk between channels may be reduced.

In the case of establishing electrical continuity between the housing 181 and the ground 124-1 of the FPC 121 without using the electrically conductive adhesive 162, it is conceivable to provide the housing 181 with fine asperities to cause protrusions of the asperities and the ground 124-$i$ to come in contact with each other. However, because the interval between channels is very narrow, a very high level of accuracy is required in mounting the housing 181 so that fine protrusions of the housing 181 and the ground 124-$i$ come in contact with each other. It is therefore difficult to provide the housing 181 with fine asperities to cause protrusions of the asperities and the ground 124-$i$ to come in contact with each other. In the optical transmitter 201 according to the other embodiment, owing to the use of the electrically conductive adhesive 162, a very high level of accuracy is not required at the time of mounting the housing 181 on the printed circuit board 111, which facilitates construction of the optical transmitter 201.

It is also conceivable to provide the back surface of the FPC 121 with the anode wires 123-$i$ and the grounds 124-$i$ and provide the front surface of the FPC 121 with the ground 126 to cause the housing 181 and the ground 126 to come in contact with each other without using the conductor 161. In this case, the area of the ground 126 is large and therefore it is easy to cause the housing 181 and the ground 126 to come in contact with each other, and a high level of accuracy is not required at the time of mounting the housing 181. However, if the anode wires 123-1 are on the back surface of the FPC 121, the anode wires 123-$i$ are far from the driver 141 and the VCSEL 151 and therefore signals are degraded. In the optical transmitter 201 according to the other embodiment, the anode wires 123-$i$ are provided on the front surface of the FPC 121 close to the driver 141 and the VCSEL 151 and therefore signals are less degraded.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical transmitter comprising:
a light emitting element;
a driver that drives the light emitting element;
a first printed circuit board that includes a first surface on which a plurality of first ground wires and a plurality of anode wires of a plurality of channels connecting the light emitting element and the driver are formed, the plurality of anode wires being covered with an insulating section, and a second surface on which a second ground wire coupled to the plurality of first ground wires is formed, the second surface being opposite the first surface;
a connector that supports the first printed circuit board and is coupled to the second ground wire;
an electrically conductive housing that covers the first printed circuit board and the connector;
a coupling member in contact with the housing and the first ground wires, the coupling member electrically coupling the housing and the first ground wires together; and
a second printed circuit board on which the connector and the housing are mounted, the second printed circuit board including a third ground wire that is electrically coupled via the connector to the second ground wire and is electrically coupled to the housing.

2. The optical transmitter according to claim 1, wherein the coupling member is an aggregate of a metal fiber and has elasticity.

3. The optical transmitter according to claim 2, wherein the metal fiber has a diameter smaller than a distance between an insulating section covering a first anode wire among the plurality of anode wires and an insulating section covering a second anode wire adjacent to the first anode wire.

4. The optical transmitter according to claim 1, wherein the coupling member is an electrically conductive adhesive.

* * * * *